(12) United States Patent
Matsui et al.

(10) Patent No.: US 8,095,094 B2
(45) Date of Patent: *Jan. 10, 2012

(54) COMMUNICATION SEMICONDUCTOR INTEGRATED CIRCUIT, COMMUNICATION ELECTRONIC COMPONENT AND WIRELESS COMMUNICATION SYSTEM

(75) Inventors: Hiroaki Matsui, Takasaki (JP); Taizo Yamawaki, Tokyo (JP); Yoshiaki Harasawa, Maebashi (JP); Steve Williams, Royston (GB)

(73) Assignees: Renesas Electronics Corporation, Kawasaki (JP); TTPCOM Limited, Melbourn (GB)

( * ) Notice: Subject to any disclaimer, the term of this patent is extended or adjusted under 35 U.S.C. 154(b) by 681 days.

This patent is subject to a terminal disclaimer.

(21) Appl. No.: 12/263,571

(22) Filed: Nov. 3, 2008

(65) Prior Publication Data

US 2009/0068967 A1    Mar. 12, 2009

Related U.S. Application Data

(63) Continuation of application No. 11/371,108, filed on Mar. 9, 2006, now Pat. No. 7,463,876.

(30) Foreign Application Priority Data

Mar. 9, 2005  (GB) .................................. 0504875.6

(51) Int. Cl.
*H01Q 11/12* (2006.01)
*H04B 1/04* (2006.01)

(52) U.S. Cl. ....................... 455/127.2; 455/126; 455/333
(58) Field of Classification Search ............... 455/67.11, 455/67.14, 108, 110, 115.1, 115.3, 126, 127.2, 455/69, 424, 522, 333; 330/75, 76, 250
See application file for complete search history.

(56) References Cited

U.S. PATENT DOCUMENTS

| | | |
|---|---|---|
| 7,082,290 B2 | 7/2006 | Takano et al. |
| 7,132,900 B2 | 11/2006 | Yahagi et al. |
| 7,366,481 B2 | 4/2008 | Okada et al. |
| 2004/0012441 A1 | 1/2004 | Mackey et al. |

FOREIGN PATENT DOCUMENTS

| | | |
|---|---|---|
| GB | 02127256 | 5/2002 |
| GB | 2389251 | 12/2003 |
| GB | 2390495 | 1/2004 |
| GB | 2393595 | 3/2004 |
| GB | 05048756 | 3/2005 |
| WO | 2004042919 A1 | 5/2004 |

*Primary Examiner* — Quochien B Vuong
(74) *Attorney, Agent, or Firm* — Mattingly & Malur, PC

(57) ABSTRACT

A communication semiconductor integrated circuit includes a phase control loop and an amplitude control loop. A gain of a variable gain amplifier when it is detected from an output of the comparator that the amplitudes of the reference signal and the feedback signal are equal to each other while a predetermined DC voltage is applied to an amplifier which amplifies an output of a transmission oscillation circuit and is controlled by the amplitude control loop to vary the gain of the variable gain amplifier on a feedback path is held in a register. Thereafter, the DC voltage is changed to another value to detect the gain of the variable gain amplifier, so that the gain of a variable gain amplifier on the forward path is decided on the basis of the detected gain and the gain held in the register.

5 Claims, 8 Drawing Sheets

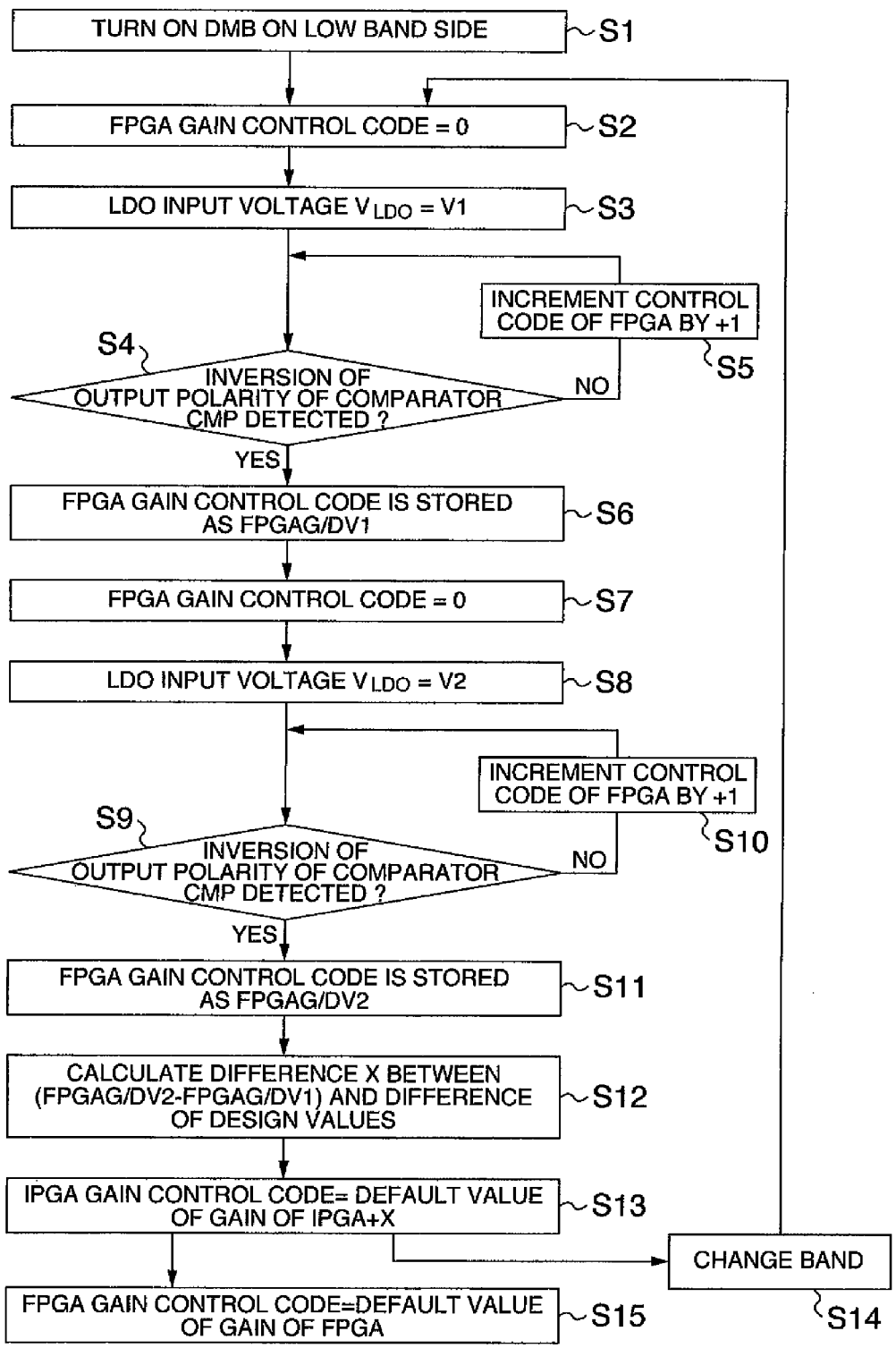

FIG. 8

| FPGA GAIN CONTROL CODE | FPGA GAIN [dB] |
|---|---|
| 0 | −6 |
| 1 | −5 |
| 2 | −4 |
| 3 | −3 |
| 4 | −2 |
| 5 | −1 |
| 6 | 0 |
| 7 | 1 |
| 8 | 2 |
| 9 | 3 |
| 10 | 4 |
| 11 | 5 |
| 12 | 6 |

FIG. 9

| | V_LDO [V] | DMB OUTPUT [dBm] | Gain[dB] BUFF(ATT) | Gain[dB] DCM | Gain[dB] FPGA | FPGA OUTPUT [dBm] |
|---|---|---|---|---|---|---|
| DESIGN VALUE | 0.9 | 10 | −20 | 0 | 0 | −10 |
| | 1.0 | 13 | | | | −7 |
| | 1.1 | 15 | | | | −5 |
| IN CASE OF EXISTING PRODUCTION DISPERSION | 0.9 | 10 | −20 | 0 | 0 | −10 |
| | 1.0 | 12 | | | | −8 |
| | 1.1 | 13 | | | | −7 |

FIG. 10

| FPGA GAIN CONTROL CODE | FPGA GAIN [dB] | FPGA OUTPUT LEVEL [dBm] | |
|---|---|---|---|
| | | VLDO1=0.9[V] | VLDO2=1.1[V] |
| | | DESIGN VALUE 1 | DESIGN VALUE 2 |
| 0 | −6 | −16 | −11 |
| 1 | −5 | −15 | −10 |
| 2 | −4 | −14 | −9 |
| 3 | −3 | −13 | −8 |
| 4 | −2 | −12 | −7 |
| 5 | −1 | −11 | −6 |
| 6 | 0 | −10 | −5 |
| 7 | 1 | −9 | −4 |
| 8 | 2 | −8 | −3 |
| 9 | 3 | −7 | −2 |
| 10 | 4 | −6 | −1 |
| 11 | 5 | −5 | 0 |
| 12 | 6 | −4 | 1 |

FIG. 11

| FPGA GAIN CONTROL CODE | FPGA GAIN [dB] | FPGA OUTPUT LEVEL [dBm] | |
|---|---|---|---|
| | | VLDO1=0.9[V] | VLDO2=1.1[V] |
| | | MEASURED VALUE 1 (CAL.1) | MEASURED VALUE 2 (CAL.2) |
| 0 | −6 | −16 | −13 |
| 1 | −5 | −15 | −12 |
| 2 | −4 | −14 | −11 |
| 3 | −3 | −13 | −10 |
| 4 | −2 | −12 | −9 |
| 5 | −1 | −11 | −8 |
| 6 | 0 | −10 | −7 |
| 7 | 1 | −9 | −6 |
| 8 | 2 | −8 | −5 |
| 9 | 3 | −7 | −4 |
| 10 | 4 | −6 | −3 |
| 11 | 5 | −5 | −2 |
| 12 | 6 | −4 | −1 | ns of specifications.

COMMUNICATION SEMICONDUCTOR INTEGRATED CIRCUIT, COMMUNICATION ELECTRONIC COMPONENT AND WIRELESS COMMUNICATION SYSTEM

CROSS-REFERENCE TO RELATED APPLICATIONS

The present application is a continuation of application Ser. No. 11/371,108, filed Mar. 9, 2006, now U.S. Pat. No. 7,463, 876; which claims priority from British patent application No. 0504875.6 filed on Mar. 9, 2005, the content of which is hereby incorporated by reference into this application.

BACKGROUND OF THE INVENTION

The present invention relates to a technique for correcting dispersion of a communication semiconductor integrated circuit having a modulation function of a transmission signal and a technique for reducing variation in characteristics due to dispersion in a gain of an amplitude control loop in a communication semiconductor integrated circuit having a phase control loop for phase modulation and the amplitude control loop for amplitude modulation. More particularly, the present invention relates to a technique effectively applicable to a semiconductor integrated circuit for high-frequency signal processing (high-frequency IC) having a modulation/demodulation function provided in a wireless or radio communication apparatus such as, for example, a portable telephone and an electronic component (RF module) using it.

One of the systems for wireless communication apparatuses (mobile communication apparatuses) such as a portable telephone of the prior art is a global system for mobile communication (GSM) adopted in Europe. The GSM system uses a phase modulation method called a Gaussian Minimum Shift Keying (GMSK) method in which a phase of a carrier wave is shifted according to transmission data.

Further, an evolved system of the GSM system to enhance data rates, that is, a system of enhanced data rates for GSM evolution (EDGE) has been proposed, the EDGE system having a dual-mode communication function in which an audio signal is communicated in the GMSK modulation and data is communicated in 3.pi./8 rotating 8-PSK (phase shift keying) modulation. The 8-PSK modulation is a modulation implemented by adding amplitude shift to the carrier phase shift in the GMSK modulation. In comparison with the GMSK modulation in which information of one bit is transmitted per symbol, information of three bits is transmitted per symbol in the 8-PSK modulation. Therefore, communication can be made at a higher transmission rate in the EDGE than in the GSM.

As a method of implementing a modulation method in which each of a phase component and an amplitude component of a transmission signal contains information, there has been known a method in which a signal to be transmitted is divided into a phase component and an amplitude component, a feedback operation is conducted for the components respectively by a phase control loop and an amplitude control loop, and signals resultant from the feedback operations are mixed with each other by an amplifier to output a signal (for example, British Patent Publication GB0212725.6)

In the above-mentioned system which has the phase control loop and the amplitude control loop and can implement wireless communication of the EDGE system, circuits constituting the amplitude control loop have dispersion of the gains due to dispersion in characteristics of constituent elements of the circuits in production and a loop gain is deviated from a design value. Accordingly, there is a possibility that the modulation precision of a transmission waveform (error vector magnitude (EVM)) and the noise suppression degree do not satisfy requirements of specifications.

Concretely, there is a problem in which while the modulation precision is higher and a characteristic called spectral re-growth indicating a degree of waveform distortion becomes better when the frequency bandwidth of the amplitude control loop (a frequency range from a central frequency of the transmission carrier wave to a frequency thereof for which an open loop gain is 0 dB) is wider, an attenuation value of the amplitude control loop becomes smaller for a reception frequency apart by 20 MHz from the central frequency of the transmission carrier wave and a sufficient noise suppression degree cannot be obtained when the bandwidth is wide. The above British Patent Publication discloses the technique for measuring dispersion in gain of the amplitude control loop and calibrating it.

In the amplitude control of the above British Patent Publication, however, a signal fed back to an amplitude comparison circuit for comparing amplitudes between a transmission signal and a feedback signal is taken out from an output of a power amplitude with a coupler provided at a succeeding stage of a high-frequency integrated circuit (IC). Accordingly, it is impossible to measure dispersion in the gain of the amplitude control loop before the system is constructed. To this end, when such measurement and calibration of dispersion are made on the side of a set maker which manufactures the wireless communication apparatus, the burden on the set maker is increased. On the other hand, when the measurement and calibration of dispersion are made on the side of an IC maker which manufactures the high-frequency IC, calibration cannot be made in consideration of dispersion in characteristics of the power amplifiers connected to the succeeding stage of the high-frequency IC and accordingly the precision of the calibration is degraded.

Further, calibration of dispersion in gain of the amplitude control loop in the invention disclosed in the Publication GB0212725.6 is made by taking data for calibrating a gain characteristic to a control signal outputted by a variable gain amplifier connected on the way of the amplitude control loop on the basis of a measured value to eliminate the dispersion and storing the calibration data in a nonvolatile memory in a baseband LSI circuit. Accordingly, the writing work of the calibration data in the nonvolatile memory is required to increase the burden on the set maker. In addition, it is also considered that a circuit for adjusting dispersion of the gain is provided for each circuit having large dispersion of the gain so that the gain is adjusted by the adjusting circuit on the basis of the measured result, although since such a method requires measurement and adjustment processes of dispersion for each chip, a cost of the integrated circuit is increased.

SUMMARY OF THE INVENTION

It is an object of the present invention to improve the modulation precision and the spectral re-growth and sufficiently suppress noise in a reception frequency band in a communication semiconductor integrated circuit having a phase control loop for phase modulation and an amplitude control loop for amplitude modulation.

It is another object of the present invention to provide a reliable communication semiconductor integrated circuit which can prevent a gain of an amplitude control loop from being deviated from a design value due to dispersion in characteristics of semiconductor devices in production and prevent the modulation precision and the noise suppression degree from being reduced due to the deviated gain and an electronic component (e.g. RF module) and a wireless communication apparatus using the communication semiconductor integrated circuit.

It is still another object of the present invention to provide a technique for calibrating a gain of an amplitude control loop in a communication semiconductor integrated circuit (e.g. high-frequency IC) having a phase control loop for phase modulation and the amplitude control loop for amplitude modulation while avoiding increased cost and burden on a set maker.

The above and other objects and novel features of the present invention will be apparent from the following description of the specification taken in connection with the accompanying drawings.

An outline of representative aspects of the present invention is as follows.

A communication semiconductor integrated circuit (high-frequency integrated circuit (IC)) includes a phase control loop for controlling a phase of a transmission signal, an amplitude control loop for controlling an amplitude of the transmission signal, and variable gain amplifier circuits disposed on a forward path and a feedback path of the amplitude control loop, wherein gains of the amplifier circuits are controlled to control a gain of the amplitude control loop. The communication semiconductor integrated circuit includes change-over means disposed on the forward path to change over an output of the variable gain amplifier circuit and a predetermined DC voltage and a comparator disposed in a succeeding stage of an amplitude comparison circuit of the amplitude control loop to decide amplitudes of a reference signal and a feedback signal. The gain of the variable gain amplifier circuit at the time when it is detected from the output of the comparator that the amplitudes of the reference signal and the feedback signal are equal to each other while the gain of the variable gain amplifier circuit on the feedback path is gradually varied in the state where the change-over means is controlled to apply the DC voltage to the amplifier which is supplied with a control voltage from the amplitude control loop and amplifies an output signal from a transmission oscillation signal in accordance with a gain conformable to the control voltage is held in a register. Thereafter, the DC voltage is changed over to another value and a second gain of the variable gain amplifier circuit at the time when it is detected from the output of the comparator that amplitudes of the reference signal and the feedback signal are equal to each other while the gain of the variable gain amplifier circuit on the feedback path is gradually varied is detected. The gain of the variable gain amplifier circuit on the forward path is decided on the basis of the second gain and the gain held in the register and is held in the register. It is preferable that the calibration is executed in response to a command supplied externally upon turning on of a power supply.

According to the above method, the calibration can be automatically executed in the actual system to set the gain of the amplitude control loop to a desired value regardless of dispersion in characteristics of constituent elements. Accordingly, it is not necessary to measure dispersion of each chip in the manufacturing process, so that the modulation precision of transmission waveform and the spectral re-growth can be improved and noise in the reception frequency band can be suppressed sufficiently while avoiding increased cost and burden on a set maker.

Effects attained by the present invention are as follows.

According to the present invention, in the communication semiconductor integrated circuit (e.g. high-frequency IC) including the phase control loop for phase modulation and the amplitude control loop for amplitude modulation, the modulation precision of transmission waveform and the spectral re-growth can be improved and noise in the reception frequency band can be suppressed sufficiently.

Further, according to the present invention, there can be realized the reliable communication semiconductor integrated circuit (high-frequency IC) and the wireless communication apparatus which can prevent deviation of the gain of the amplitude control loop from the design value due to dispersion in characteristics of constituent elements in production and reduction of the modulation precision and the noise suppression degree caused by the deviation.

Moreover, according to the present invention, the gain of the amplitude control loop in the communication semiconductor integrated circuit (high-frequency IC) including the phase control loop for phase modulation and the amplitude control loop for amplitude modulation can be calibrated while avoiding increased cost and burden on a set maker.

Other objects, features and advantages of the invention will become apparent from the following description of the embodiments of the invention taken in conjunction with the accompanying drawings.

BRIEF DESCRIPTION OF THE DRAWINGS

FIG. 4 is a flow chart showing a procedure of calibration of an amplitude control loop in the high-frequency integrated circuit of the embodiment;

FIG. 8 is a table showing the correspondence relation between control gains and gain control codes of FPGA stored in a register 252;

FIG. 9 is a table showing the relation of input voltages of an amplifier 249, output levels of amplifiers 242a and 242b and output levels of FPGA 246;

FIG. 10 is a table showing an example of relation of gain control codes, control gains and output levels of FPGA; and FIG. 11 is a table showing an example of relation of gain control codes, gains deviated from a design value and output levels of FPGA.

DESCRIPTION OF THE INVENTION

A preferred embodiment of the present invention is now described with reference to the accompanying drawings.

Figure 1:
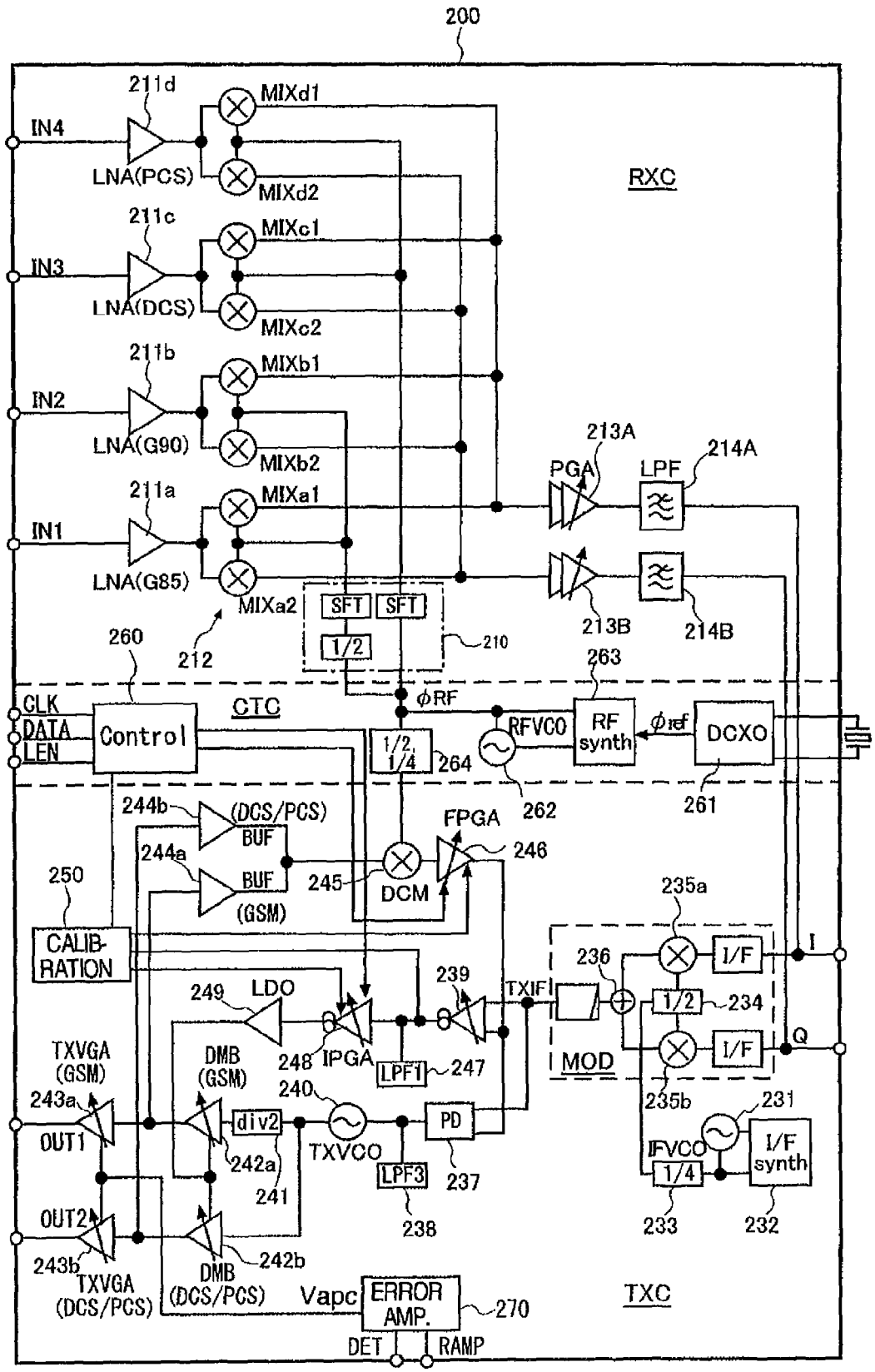
FIG. 1 is a block diagram schematically illustrating an embodiment of a high-frequency integrated circuit (IC) to which the present invention is applied and which has a modulation/demodulation function of a transmission/reception signal and can make GMSK modulation in GSM system and 8-PSK modulation in EDGE system.

FIG. 1 schematically illustrates an embodiment of a high-frequency integrated circuit (IC) to which the present invention is applied and which has a modulation/demodulation function of a transmission/reception signal and can make GMSK modulation in GSM system and 8-PSK modulation in EDGE system. The high-frequency IC 200 of the embodiment is constituted as a high-frequency IC of a multi-band system capable of making modulation/demodulation of signals in four frequency bands using three communication systems of GSM 850 and 900, DCS (digital cellular system) 1800 and PCS (personal communications system) 1900, although it is not limited thereto.

The high-frequency IC 200 of the embodiment includes, when divided broadly, a receiving circuit RXC, a transmitting circuit TXC and a control circuit CTC including other circuits common to the transmitting and receiving circuits such as a controller and a clock generator.

The receiving circuit RXC includes low-noise amplifiers 211*a*, 211*b*, 211*c* and 211*d* which amplify received signals of frequency bands for PCS, DCS and GSM, a frequency dividing and phase shifting circuit 210 which frequency-divides a local oscillation signal .phi.RF generated by a high-frequency oscillation circuit (RFVCO) described later to generate orthogonal signals having phases shifted by 90.degree. from each other, a demodulation and frequency conversion unit 212 composed of mixers MIXa1, MIXa2, MIXb1, MIXb2, MIXc1, MIXc2, MIXd1 and MIXd2 which mix the received signals amplified by the low-noise amplifiers 211*a*, 211*b*, 211*c* and 211*d* with the orthogonal signals generated by the frequency-dividing and phase shifting circuit 210 to thereby make demodulation and down-conversion, high-gain amplifier circuits 213A and 213B which amplify demodulated I and Q signals, respectively, to be outputted to a baseband circuit 300 and are common to each band, and filters 214A and 214B which eliminate noise from the signals amplified by the high-gain amplifier circuits 213A and 213B. The receiving circuit RXC of the embodiment adopts a direct conversion system for down-converting the received signals to signals in the frequency band of the baseband directly.

The control circuit CTC includes a controller (control logic) 260 which controls the whole chip, a reference oscillation circuit (DCXO) 261 which generates a reference oscillation signal .phi.ref, a high-frequency oscillation circuit (RFVCO) 262 constituting a local oscillation circuit which generates a high-frequency oscillation signal .phi.RF for frequency conversion, an RF synthesizer 263 constituting a PLL circuit together with the high-frequency oscillation circuit (RFVCO) 262 and a frequency dividing circuit 264 which frequency-divides the oscillation signal .phi.RF generated by the RFVCO 262. The frequency dividing circuit 264 is controlled by a signal from the controller 260 and frequency-divides the oscillation signal .phi.RF by four in the GSM mode that transmission/reception is made in accordance with the GSM system and by two in the DCS or PCS system to be supplied to the transmitting circuit TXC.

The controller 260 is supplied with a clock signal CLK for synchronization and a data signal DATA supplied from the baseband circuit and a load enable signal LEN supplied therefrom as a control signal. When the load enable signal LEN is changed to an effective level, the controller 260 successively takes in the data signal DATA transmitted from the baseband circuit in synchronism with the clock signal CLK and generates a control signal used in chip in response to a command contained in the data signal DATA. The data signal DATA is transmitted serially, although it is not limited thereto.

Further, since the reference oscillation signal .phi.ref is required to have a higher frequency precision, an external crystal oscillation element is attached to the reference oscillation circuit 261 of RF IC. A frequency such as 26 or 13 MHz is selected as the reference oscillation signal .phi.ref. The RF synthesizer 263 is constituted by a frequency dividing circuit, a phase comparison circuit, a charging pump, a loop filter and the like.

The transmitting circuit TXC includes an IFVCO 231 which generates an oscillation signal .phi.IF having an intermediate frequency such as, for example, 640 MHz, an IF synthesizer 232 constituting a PLL circuit together with the IFVCO 231, a frequency dividing circuit 233 which frequency-divides the oscillation signal .phi.IF generated by the IFVCO 232, a frequency dividing and phase shifting circuit 234 which further frequency-divides the signal frequency-divided by the frequency dividing circuit 233 and generates orthogonal signals (80 MHz) having phases shifted by 90.degree. from each other, modulation circuits (mixers) 235*a* and 235*b* which modulate the generated orthogonal signals by I and Q signals supplied from the baseband circuit, an adder 236 which combines the modulated signals, a low pass filter (LPF), a transmission oscillation circuit (TXVCO) 240 which generates a transmission signal .phi.TX having a predetermined frequency (about 2 GHz), a frequency-dividing circuit 241 which frequency-divides the transmission signal .phi.TX outputted by the transmission oscillation circuit 240 to generate a transmission signal for the GSM system, variable gain amplifiers (DMB) 242*a* and 242*b* which amplify the transmission signal, and output amplifiers (TX-VGA) 243*a* and 243*b* constituted by variable gain amplifiers which further amplify the signals amplified by the variable gain amplifiers 242*a* and 242*b* to be outputted outside of a chip 200.

Further, the transmitting circuit TXC includes buffers (attenuators) 244*a* and 244*b* which adjust (attenuate) amplitudes of the signals amplified by the variable gain amplifiers 242*a* and 242*b* to be fed back, an offset mixer 245 which mixes the feedback signal with a signal .phi.RF' obtained by frequency-dividing the high-frequency oscillation signal .phi.RF generated by the high-frequency oscillation circuit (RFVCO) 262 to thereby generate a signal having a frequency corresponding to a difference between the frequencies thereof, a variable gain amplifier (FPGA) 246 which amplifies an output of the offset mixer 245, a phase comparison circuit 237 which compares the feedback signal amplified by the variable gain amplifier (FPGA) 246 with a signal TXIF combined by the adder 236 to detect a phase difference, and a loop filter 238 which generates a voltage corresponding to an output of the phase detector 237 and supplies it to the transmission oscillation circuit (TXVCO) 240 as a control voltage. The phase comparison circuit 237, the TXVCO 240, the variable gain amplifiers 242*a*, 242*b*, the buffers 244*a*, 244*b*, the offset mixer 245 and the variable gain amplifier 246 constitute a phase control loop.

In addition, the transmitting circuit TXC includes an amplitude comparison circuit 239 which compares the feedback signal amplified by the variable gain amplifier 246 with the signal TXIF combined by the adder 236 to detect an amplitude difference therebetween, a loop filter 247 for an amplitude control loop which limits a band of an output of the amplitude comparison circuit 239, a variable gain amplifier (IPGA) 248 which amplifies a signal of the amplitude control loop, a fixed gain amplifier (LDO) 249 which is supplied with an output of the variable gain amplifier 248 and generates a control voltage supplied to the variable gain amplifier 242*a* and 242*b* connected to a succeeding stage of the TXVCO 240, and a calibration execution circuit 250 which executes calibration of the amplitude control loop in accordance with the control signal supplied from the controller 260. The variable gain amplifier 242a is to amplify the transmission signal on the low band side, that is, in the GSM of 850 to 900 MHz and the variable gain amplifier 242b is to amplify the transmission signal on the high band side, that is, in the DCS of 1800 MHz and in the PCS of 1900 MHz.

The transmitting circuit TXC of the embodiment adopts the offset PLL method in which the I and Q signals for transmission are orthogonally modulated by the carrier wave having the intermediate frequency and the feedback signal from the output side of the TXVCO 240 is mixed with the signal .phi.RF' obtained by frequency-dividing the high-frequency oscillation signal .phi.RF of the RFVCO 262 to thereby be down-converted to the signal having the intermediate frequency corresponding to a frequency difference (offset), which signal is then phase-compared with the orthogonally modulated signal to control the TXVCO 240 in accordance with the phase difference. The transmitting circuit TXC of the embodiment further includes an error amplifier 270 which compares a signal RAMP indicating an output level from the baseband circuit with a detection signal DET from an output level detection circuit provided in a power module which power-amplifies the transmission signal outputted from the output amplifiers 243a and 243b to generate a control voltage Vapc which controls a gain of the output amplifiers 243a and 243b in accordance with a potential difference. The output amplifiers 243a and 243b has the variable gain width of about 60 dB.

In the high-frequency IC 200 of the multi-band system of the embodiment, the controller 260 changes the frequency .phi.RF of the oscillation signal of the high-frequency oscillation circuit 262 upon transmission/reception in accordance with a band and a channel to be used in response to a command from the baseband circuit and changes a frequency ratio of the frequency dividing circuit 264 in accordance with the GSM mode or the DCS/PCS mode so that the frequency of the oscillation signal supplied to the receiving circuit RXC or the transmitting circuit TXC is changed to thereby change the frequency for transmission or reception. Further, in the embodiment, the oscillation frequency of the IFVCO 231 is set by the control signal from the controller 260 in accordance with the frequency to be used upon transmission. In addition, upon calibration, the controller 260 supplies the control signal for starting the calibration to the calibration execution circuit 250.

Figure 2:
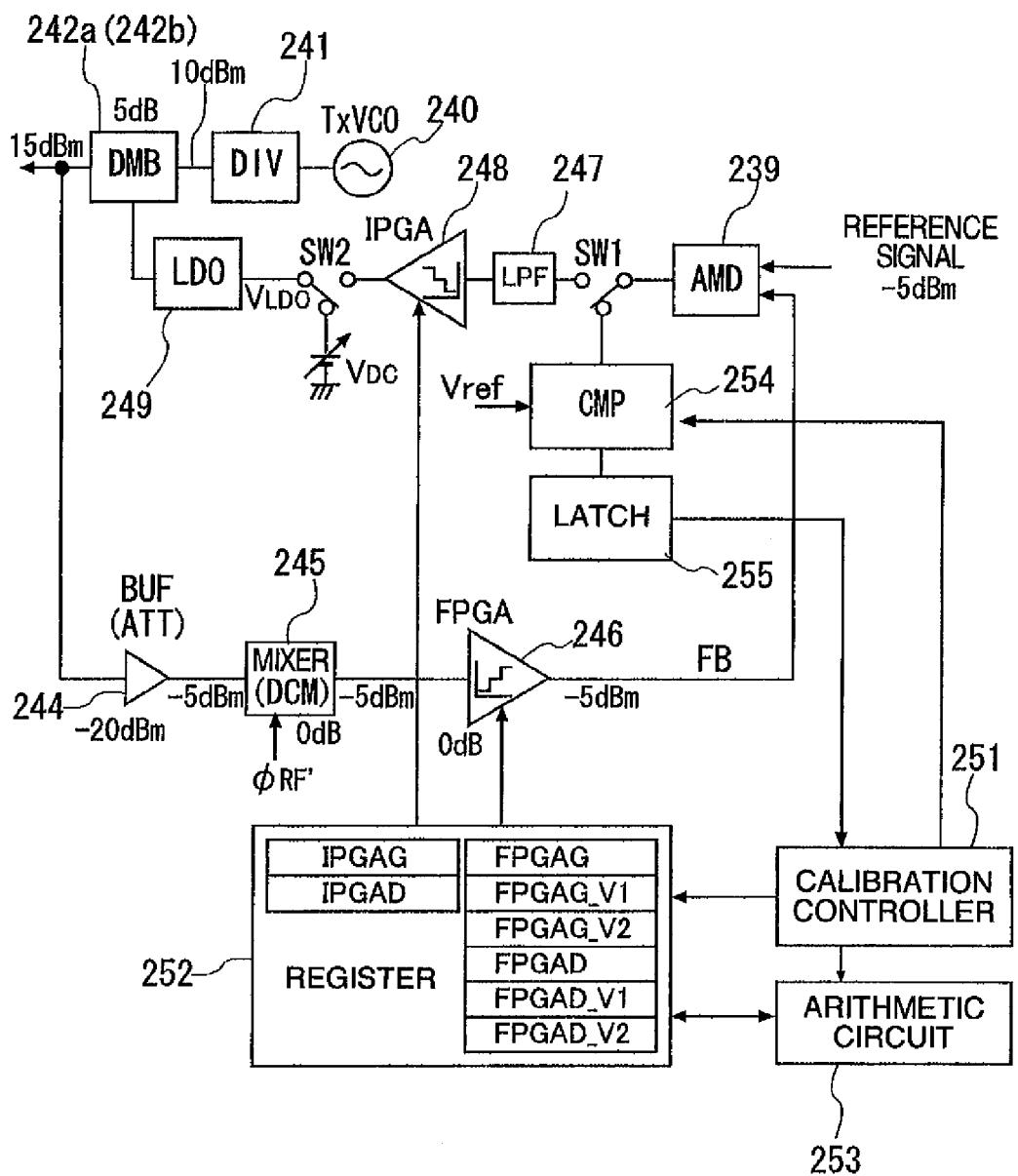
FIG. 2 is a block diagram illustrating a more concrete example of a transmitting circuit TXC in the high-frequency integrated circuit IC of the embodiment.

FIG. 2 is a block diagram showing a more concrete configuration example of the transmitting circuit TXC in the high-frequency IC of the embodiment.

As described above, the transmitting circuit TXC of the embodiment includes two control loops of a feedback loop for phase control (phase control loop) and a feedback loop for amplitude control (amplitude control loop). In FIG. 2, the configuration of the amplitude control loop characterizing the present invention is shown but the phase control loop is omitted. In FIG. 2, the like circuits and elements to those shown in FIG. 1 are designated by like reference numeral and duplicated description thereof is omitted.

The transmitting circuit TXC further includes, as circuits and elements not shown in FIG. 1 but shown in FIG. 2, a calibration controller 251, a register 252 which sets gains of the variable gain amplifier (IPGA) 248 on a forward path and the variable gain amplifier (FPGA) 246 on a feedback path and holds a measured value, an arithmetic circuit 253 which calculates the gain of the variable gain amplifier 246 from the measured value, a comparator 254 which detects an amplitude difference between a reference signal and the feedback signal, a change-over switch SW1 which is disposed among a latch circuit 255 which holds a comparison result, the loop filter 247 and the variable gain amplifier (IPGA) 248, and a change-over switch SW2 which is connected between the variable gain amplifier (IPGA) 248 and the amplifier (LDO) 249 and can supply to the amplifier 249 a fixed DC voltage VDC instead of the output of the variable gain amplifier 248. The switches SW1 and SW2 are formed of semiconductor.

The calibration controller 251, the register 252, the arithmetic circuit 253, the comparator 254, the latch 255 and the change-over switches SW1 and SW2 constitutes the calibration execution circuit 250 of FIG. 1. The calibration controller 251 may be integrated with the controller 260 of FIG. 1. The change-over switches SW1 and SW2 are connected to form the amplitude control loop upon the normal operation (upon transmission) and the respective contacts of the switches SW1 and SW2 are connected to the comparator 254 and the fixed DC voltage VDC upon execution of the calibration, respectively.

Further, the variable gain amplifier 242b which amplifies the transmission signal on the high band, that is, in DCS and PCS is shown in FIG. 1, although it is not shown in FIG. 2. Since the amplitude control loop of the embodiment acts similarly even for the variable gain amplifier 242b, only the variable gain amplifier (DMB) 242a which amplifies the transmission signal on the low band, that is, in GSM is shown and the configuration and the operation of the calibration circuit of the amplitude control loop are now described.

Circuits on the amplitude control loop in the transmitting circuit TXC of the embodiment are constituted by differential circuits and signals on the forward path and the feedback path are transmitted as differential signals, although not clear in the drawing. In the amplitude control loop of the embodiment, dispersion in characteristic of an output voltage to a control voltage in the variable gain amplifier (DMB) 242a having the gain controlled by a voltage from the forward path exerts largest influence on change of the loop band.

Figure 3A:
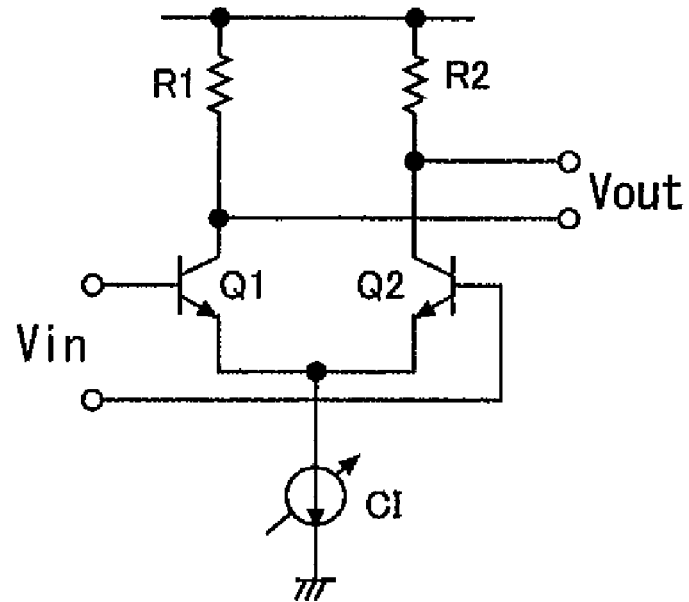
FIGS. 3A and 3B are circuit diagrams illustrating definite examples of a variable gain amplifier disposed on a feedback path and a forward path of an amplitude control loop.

When the IPGA 248 on the forward path utilizes the circuit using a variable current source as a current source of a general differential amplifier circuit composed of operation transistors Q1 and Q2, collector resistors R1 and R2 and a constant current source CI as shown in FIG. 3A, for example, the gain thereof is difficult to be influenced by dispersion in characteristics of constituent elements in production. Further, since the IPGA 248 is operated in a relative low frequency band equal to or smaller than several MHz, deviation in characteristic from a design value is small and variation in gain upon operation is also small.

Figure 3B:
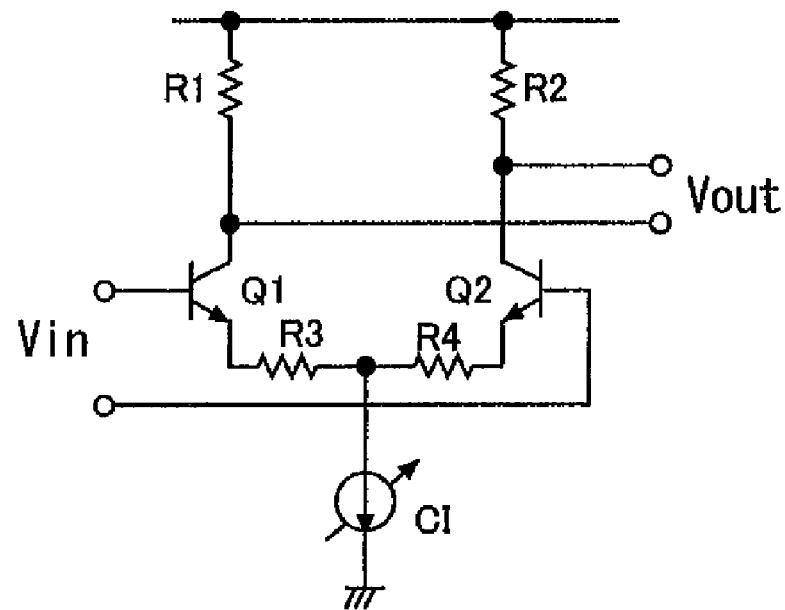

Since the FPGA 246 has a higher operation frequency band as compared with the IPGA 248, variation in gain upon operation is larger than the IPGA as far as the FPGA 246 is constituted by the same circuit as the IPGA. When the FPGA 246 utilizes a differential amplifier circuit having emitter resistors R3 and R4 as shown in FIG. 3B, the gain thereof depends on a ratio of the emitter resistors R3, R4 and the collector resistors R1, R2. Even if values of resistors on a chip of a semiconductor integrated circuit are dispersed, dispersion in a ratio of resistors is small and accordingly in the embodiment the FPGA 246 utilizes the differential amplifier circuit of FIG. 3B to thereby reduce variation in gain.

Further, in the embodiment, the change-over switches SW1 and SW2 are disposed in the preceding stage and the succeeding stage of the IPGA 248, respectively, to separate the IPGA 248 from the amplitude control loop upon calibration to make measurement. Consequently, it is not entirely necessary to consider how the gain of the IPGA is set upon calibration and calibration is made easily. On the other hand, the fixed gain amplifier (LDO) 249 can also utilizes a general differential amplifier circuit and the gain thereof is difficult to be influenced by dispersion in characteristics of constituent elements in production. Since the gain of the amplifier 249 is fixed, it is not necessary to consider change in gain upon calibration. Accordingly, the fixed DC voltage VDC is applied to the fixed gain amplifier (DMB) 242a through the amplifier 249 to thereby make calibration in consideration of dispersion in gain of the amplifier 249.

Although not limited, in the embodiment, two kinds of voltages of, for example, 0.9 V and 1.1 V are provided as the fixed DC voltage VDC supplied to the amplifier 249 by means of the switch SW2 upon execution of calibration instead of the output voltage of the IPGA 248. The gain of the amplitude control loop can be calibrated on the basis of the measured results at two voltage points of 0.9 V and 1.1 V to thereby execute relatively correct calibration in a short time. Incidentally, calibration of the gain of the amplitude control loop based on the measured results is attained by correcting values of gain control codes for the FPGA 246 and the IPGA 248 set to the register 252.

The comparator 254 compares the output voltage of the amplitude comparison circuit 239 with a predetermined reference voltage Vref to decide which amplitude of the reference signal and the feedback signal is larger. The amplitude comparison circuit 239 is a kind of mixer and outputs a voltage according to a difference between the reference signal and an amplitude component (envelope) of the feedback signal.

The reference signal upon execution of calibration is a carrier signal which is obtained by inputting only the orthogonal signal from the frequency dividing and phase shifting circuit 234 to the modulation circuits (mixers) 235a and 235b and which is not subjected to modulation by the I and Q signals.

Further, calibration of the amplitude control loop may be automatically started in accordance with a micro-sequence in the calibration controller 251 by starting the calibration controller 251 by a reset signal produced in the chip in response to turning on of a power supply, for example. In the embodiment, however, the calibration is started in response to a command supplied to the controller 260 from the external baseband circuit. Accordingly, in the high-frequency IC of the embodiment, the command can be inputted to thereby execute the calibration of the amplitude control loop at any time, although there is generally considered that it is sufficient that the calibration is executed only once upon turning on of the power supply.

The calibration method of the amplitude control loop of the embodiment is now described with reference to the flow chart of FIG. 4.

FIG. 4 shows a procedure of the calibration. The calibration according to the flow chart is started when a predetermined command code is supplied to the controller 260 from the baseband circuit. It is supposed that when an initialization command and initial values are supplied to the controller 260 from the baseband circuit before the calibration is started, a default value designating a gain of the variable gain amplifier (FPGA) 246 on the feedback path and a default value designating a gain of the variable gain amplifier (IPGA) 248 on the forward path are stored in the register 252 by the controller 260.

The default values are control codes designating gains decided as optimum values on the basis of characteristics of circuits constituting the amplitude control loop upon design of the circuits and there are four default values containing default values "FPGAG" and "IPGAG" for the circuit on the low band side and default values "FPGAD" and "IPGAD" for the circuit on the high band side. Further, it is supposed that a carrier signal which is not modulated is supplied to the amplitude comparison circuit 239 as a reference signal before the calibration is started.

When the calibration is started, the variable gain amplifier 242b on the high band side is set to a stopped state and only the variable gain amplifier 242a on the low band side is operated by the control signal from the calibration controller 251 (step S1). Further, the control code "0" for setting the gain of FPGA 246 to be a minimum value is supplied to FPGA 246 (step S2).

Subsequently, the contacts of the change-over switches SW1 and SW2 which are usually connected to form the amplitude control loop are connected to the comparator 254 and the DC voltage VDC, respectively, to open the amplitude control loop. The DC voltage VDC is selectively set to a fixed voltage V such as 0.9 V which is a lower voltage within the range of voltages inputted to the amplifier (LDO) 249 upon usual operation and is applied to an input terminal of the amplifier 249 (step S3). In this state, whether an output voltage of the amplitude comparison circuit 239 which compares the reference signal with the feedback signal is equal to or larger than the reference voltage or not is decided on the basis of an output level of the comparator 254 (step S4). Since the gain of FPGA 246 is first set to the minimum value by the control code "0", the output of the comparator 254 is a low level. In this case, the control code designating the gain of FPGA 246 is increased by one level in step S5 and the process is returned to step S4, in which whether the output polarity of the comparator 254 is inverted or not is decided. The control code at the time when the output polarity of the comparator 254 is inverted is stored in the register 252 as "FPGAG_V1" (step S6).

Next, the control code "0" for setting the gain of FPGA 246 to be the minimum value is supplied to FPGA 246 (step S7). Further, a fixed voltage V2 such as 1.1V higher than the fixed voltage V1 is selected as the DC voltage VDC and is supplied to the input terminal of the amplifier 249 (step S8). In this state, whether the output voltage of the amplitude comparison circuit 239 which compares the reference signal with the feedback signal is larger than or equal to the reference voltage or not is decided on the basis of the output level of the comparator 254 (step S9).

When the output of the comparator 254 is a low level, the control code designating the gain of FPGA 246 is increased by one level in step S10 and then the process is returned to step S9, in which it is decided whether the output polarity of the comparator 254 is inverted or not. When the output polarity of the comparator 254 is inverted, the control code at this time is stored in the register 252 as "FFPGAG_V2" (step S11) Subsequently, the arithmetic circuit 253 calculates a difference Y from the codes "FPGAG_V1" and "FPGAG_V2" stored in the register 252 and also calculates a difference X between the difference Y of the measured values and the difference Y0 of the design values (step S12). The difference X is added to the default value "IPGAG" for the variable gain amplifier (IPGA) 248 on the forward path and its added result is stored in the register 252 as the gain setting code "IPGAG" for the IPGA 248 upon transmission operation (step S13). At this time, the gain setting code of IPGA newly obtained may be overwritten on the default value previously stored in the register 252 or may be stored in a separate area.

Thereafter, in step S14, the band in which the calibration is made is changed, that is, the variable gain amplifier 242a on the low band side is set to the stopped state and the variable gain amplifier 242b on the high band side is set to an operation state. Then, the process is returned to step S2 and the above operation is repeated, so that the control codes "FPGAD_V1" and "FPGAD_V2" at the time when the output polarity of the comparator 254 is inverted is detected to be stored in the register 252 and the gain setting code "IPGAD" for the variable gain amplifier 242b used upon transmission on the high band side is calculated from the codes "FPGAD_V1" and "FPGAD_V2" to be stored in the register 252.

The calibration is completed by the foregoing operation. In the actual transmission operation after the completion of the calibration, the default values "FPGAG" and "FPGAD" are set as the gain control codes of FPGA 246 (step S15). Consequently, even if the gain of the amplitude control loop is dispersed due to dispersion in characteristics of constituent elements in production, the gain of the IPGA 248 in the transmission operation is set so that deviation of the gain of the whole loop excluding the IPGA 248 is calibrated by the above calibration. Accordingly, the band of the amplitude control loop can approach a target value upon design, so that the modulation precision upon transmission can be enhanced and the noise suppression degree can be improved.

Next, the calibration operation of the amplitude control loop of the embodiment is described by using concrete numerical values as an example.

It is supposed that the output level of the transmission oscillation circuit (TXVCO) 240 is +10 dBm, the gain of the amplifiers (DMB) 242a, 242b 5 dB, the gain of the buffer (BUF) 244a, 244b on the feedback path −20 dBm, the gain of the offset mixer 245 0 dB and the center gain of the FPGA 246 0 dB and the FPGA 246 has the gain control range of .+−.6 dB in which the gain can be controlled in unit of 1 dB as shown in Table in FIG. 8. When it is supposed that the level of the reference signal supplied to one input of the amplitude comparison circuit (AMD) 239 is −5 dBm, the gain of the FPGA 246 is set to 0 dB of the center by the control code and when the gains of the respective circuits on the amplitude control loop are set as described above, the level of the feedback signal FB is −5 dBm and can be matched to the level of the reference signal.

The number of bits of the control code designating the gain of the FPGA 246 is decided in consideration of dispersion in gain of the amplitude control loop in production, the output levels of the amplifiers (DMB) 242a, 242b, the fixed voltage VDC applied through the switch SW2 upon calibration and the gain control range and the unit of a controllable minimum gain (calibration precision) of the FPGA 246. When the gains of the circuits on the amplitude control loop are set as described above and the gain control range of the FPGA 246 is .+−.6 dB in which the gain can be controlled in unit of 1 dB, the number of bits of the control code is 4. As described above, since the result of the calibration is reflected to the gain of the IPGA 248, the gain control range and the unit of the controllable minimum gain of the IPGA 248 are preferably matched to those of the FPGA 246 and in this case the numbers of bits of the control loop for both of them are also equal to each other.

Figure 5:
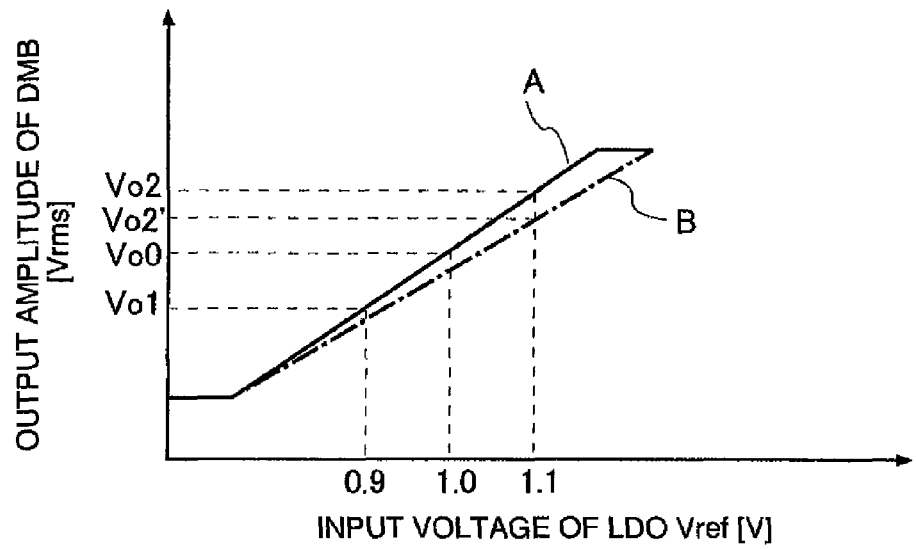
FIG. 5 is a graph showing an input/output characteristic of a variable gain amplifier (DM B) disposed in the succeeding stage of a transmission oscillation circuit of the high-frequency integrated circuit of the embodiment.

As described above, most of dispersion in the gain of the amplitude control loop in the embodiment is considered to be caused by output voltage characteristics of the amplifiers (DMB) 242a, 242b. FIG. 5 is a graph showing the relation between an input voltage VLDO of the amplifier (LDO) 249 and output amplitudes of the amplifier (DMB) 242a, 242b. In FIG. 5, solid line A represents a design value, that is, the characteristic at the time that it is assumed that there is no dispersion in characteristics of constituent elements in production and one-dot chain line B represents the characteristic in case where the characteristic of the output voltage to the control voltage of the amplifiers (DMB) 242a, 242b is shifted or deviated to the low sensitivity due to dispersion in characteristics of constituent elements in production. Further, FIG. 9 is a table showing the relation of the input voltage VLDO of the amplifier (LDO), the output level of the amplifiers (DMB) 242a, 242b and the output level of the FPGA 246.

In the design values, when the input voltages VLDO of the amplifier (LDO) 249 are 0.9, 1.0 and 1.1 V, the output levels of the amplifier (DMB) are 10, 13 and 15 dBm and the output levels of the FPGA are −10, −7 and −5 dBm, respectively, whereas it is supposed that when the output voltage characteristic of the amplifier (DMB) is shifted or deviated as shown by one-dot chain line B due to dispersion in characteristics of constituent elements in production, the output levels of the amplifier (DMB) are as smaller than the design value as 10, 12 and 13 dBm and the output levels of the FPGA are also as smaller than the design value as −10, −8 and −7 dBm, respectively.

In the high-frequency IC of the embodiment, in order to understand inclined deviation of the output voltage characteristic of the amplifier (DMB) 242a by the calibration of the amplitude control loop executed according to the processing of the above-mentioned flow chart, two fixed voltages VDC of 0.9 and 1.1 V are inputted as the input voltage VLDO of the amplifier (LDO) 249 and the gain of the FPGA is gradually increased from the smallest gain (−6 dBm) by 1 dB to store the control codes in the register 252 as "FPGAG_V1" and "FPGAG_V2" when the output of the comparator is inverted.

FIG. 10 shows an example of the relation of the control codes of FPGA, the gains of FPGA for the design values and the output levels of FPGA for the design values at the time that 0.9 and 1.1 V are inputted as the input voltages VLDC of the amplifier (LDO) 249. FIG. 11 shows an example of the relation of the control codes of FPGA, the gains of FPGA when shifted or deviated from the design values and the measured output levels of FPGA at the time that 0.9 and 1.1 V are inputted to the amplifier (LDO) 249.

It is understood from the table of FIG. 10 that when VLDO is 0.9 V the control code is "11" at the time that the output level of FPGA for the design value is equal to the level −5 dBm of the reference signal, and it is understood from the table of FIG. 11 that when VLDO is 0.9 V the control code is also "11" at the time that the measured output level of FPGA is equal to the level −5 dBm of the reference signal. On the other hand, it is understood from the table of FIG. 10 that when VLDO is 1.1 V the control code is "6" at the time that the output level of FPGA for the design value is equal to the level −5 dBm of the reference signal, and it is understood from the table of FIG. 11 that when VLDO is 1.1 V the control code is "8" at the time that the measured output level of FPGA is equal to the level −5 dBm of the reference signal.

Accordingly, the difference Y of the measured values calculated in step S12 of the flow chart of FIG. 4 is 11−8=3. On the other hand, the difference Y0 of the design value is 11−6=5. Therefore, the difference X (=Y0−Y) between the difference Y of the measured values and the difference Y0 of the design values is 2. Consequently, in step S13, the difference X is added to the default value "IPGAG"="6" for the IPGA on the forward path to be stored in the register 252 as the gain setting code "IPGAG" and its value is 6+2=8.

As described above, in the amplitude control loop of the embodiment, the gain control range and the unit of a controllable minimum gain of the IPGA 248 are matched to those of the FPGA 246 and accordingly when the gain setting code "IPGAG" of the IPGA is set to "8", the gain of the IPGA is +2 dB from the table of FIG. 10. That is, it is understood that when the gain of the FPGA 246 is reduced by −2 dB due to dispersion in characteristics of constituent elements in production, the gain of the IPGA 248 is increased by 2 dB.

It is understood from the foregoing description that the gain of the whole amplitude control loop, that is, the loop band is kept substantially constant by the calibration regardless of dispersion in characteristics of constituent elements in production. Further, in the embodiment, since the calibration is automatically executed in the high-frequency IC upon turning on of a power supply or the like, it is not necessary to adjust the gain of the amplitude control loop individually after it is mounted in the system such as a portable telephone and the cost thereof can be reduced.

Figure 6:
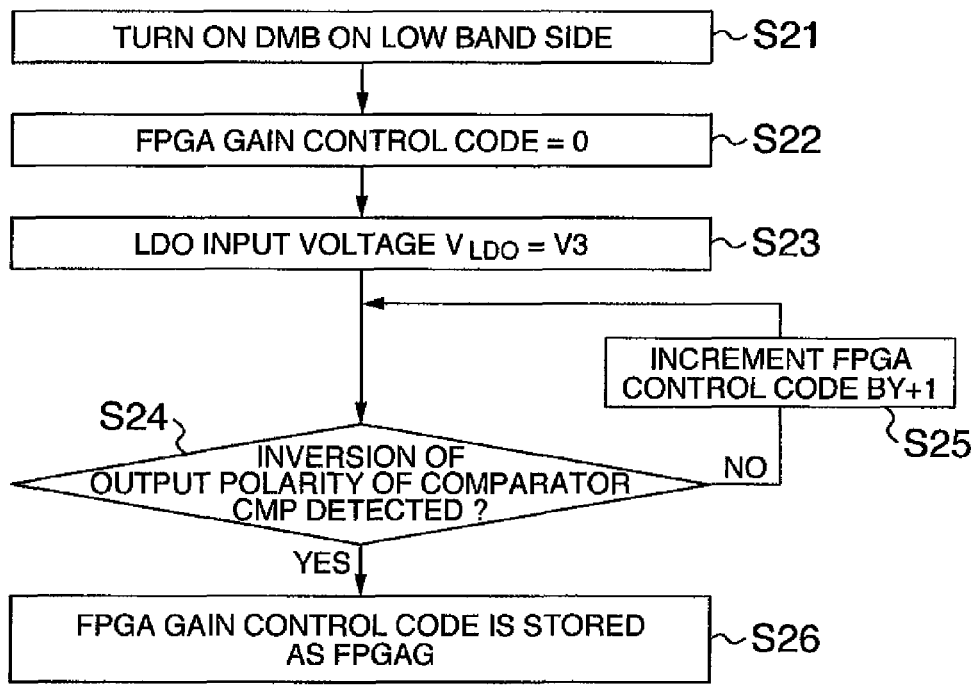
FIG. 6 is a flow chart showing a procedure of calibration in case where transmission is made in a GMSK modulation mode in which only a phase modulation is made.

Referring now to the flow chart of FIG. 6, the calibration in case where transmission is made in the GMSK modulation mode in which only the phase modulation is made in the high-frequency IC of the embodiment is described.

In the GMSK modulation mode, since the amplitude modulation is not required, the high-frequency IC is operated while maintained to a predetermined gain, that is, in the state where the input of the amplifier (LDO) 249 is not varied by applying a fixed voltage to the variable gain amplifier 242a (or 242b) in the succeeding stage of the TXVCO 240 through the amplifier (LDO) 249 on the forward path of the amplitude control loop. Accordingly, when the gains of the variable gain amplifier (PMB) 242a and the variable gain amplifier (FPGA) 246 on the feedback path are deviated from the design values due to dispersion in characteristics of constituent elements in production, the phase control cannot be made with high accuracy and accordingly the calibration is required. For this purpose, the calibration according to the flow chart of FIG. 6 is executed.

The calibration can be started by supplying a predetermined command code from the baseband circuit to the controller 260. Further, similarly to the case of the EGDE modulation mode, it is supposed that the default value designating the gain of the variable gain amplifier (FPGA) 246 on the feedback path and the default value designating the gain of the variable gain amplifier (IPGA) 248 on the forward path are stored in the register 252 by the controller 260 before the calibration is started.

When the calibration is started, the variable gain amplifier 242b on the high band side is set to the stopped state and the variable gain amplifier (DMB) 242a on the low band side is set to the operation state by the control signal from the controller 251 (step S21). Further, the control code "0" for setting the gain of the FPGA 246 to a minimum value is supplied to the FPGA 246 (step S22). The contacts of the change-over switches SW1 and SW2 which are usually connected to form the amplitude control loop are connected to the comparator 254 and the DC voltage VDC, respectively, to open the amplitude control loop. At this time, the DC voltage VDC is selectively set to a value V3 close to the voltage inputted to the amplifier (LDO) 249 when the transmission is made in the GMSK modulation mode and is applied to the input terminal of the amplifier 249 (step S23).

Subsequently, in this state, whether the output voltage of the amplitude comparison circuit 239 which compares the reference signal with the feedback signal is larger than or equal to the reference voltage or not is decided on the basis of the output level of the comparator 254 (step S24). Since the gain of the FPGA 246 is first set to a minimum value by the control code "0", the output of the comparator 254 is a low level. In this case, the control code designating the gain of the FPGA 246 is increased by one level in step S25 and the process is returned to step S24, in which it is decided whether the output polarity of the comparator 254 is inverted or not. When the output polarity of the comparator 254 is inverted, the control code "FPGAG_V3" of the gain of the FPGA 246 at this time is stored in the register 252 as the gain setting code "FPGAG" of the FPGA 246 in the transmission operation in the low band (step S26).

Then, after the band in which the calibration is made is changed, the process is returned to step S21 and the above operation is repeated, so that the control codes "FPGAD_V3" at the time when the output polarity of the comparator 254 is inverted is stored in the register 252 as the gain setting code "FPGAD" of the FPGA 246 in the transmission operation in the high band.

Next, the calibration operation of FIG. 6 is described using an example of concrete numerical values. If it is supposed that 1.1 V is selected as the voltage V3 inputted to the LDO 249 in step S23, the design value of the output level of the FPGA 246 is −5 dBm and if it is supposed that the actual gain of the FPGA 246 at this time is deviated by −2 dB as shown by thick character in the table of FIG. 11, the gain control code "FPGAG_V3" at the time that the output polarity of the comparator 254 is inverted is "8".

When the gain control code is set as the gain control code in the transmission operation, the gain of the FPGA 246 is +2 dB and the output level of the FPGA is −5 dBm. In other words, it is understood that when the gain of the FPGA 246 is reduced by −2 dB due to dispersion in characteristics of constituent elements in production, the gain of the FPGA 246 upon the transmission operation in the GMSK modulation mode is increased by 2 dB. The gain control code of the IPGA 248 upon the transmission operation in the GMSK modulation mode is the default value. Even if the gain of the FPGA 246 is dispersed due to dispersion in characteristics of constituent elements in production, the gain on the feedback path of the amplitude control loop is kept substantially constant by the calibration regardless of dispersion in characteristics of constituent elements in production.

It is understood that when the processing procedure in steps S22 to S26 of FIG. 6 are compared with that in steps S7 to S11 of FIG. 4, both the processing procedures are the same. Accordingly, when the calibration for the EDGE modulation mode is made, the value close to the voltage inputted to the amplifier (LDO) 249 when transmission is made in the GMSK modulation mode can be selected as the voltage V2 inputted to the amplifier (LDO) 249 in step S7 of FIG. 4 and the gain control code "FPGAG_V2" obtained by measurement can be stored in the register 252 to thereby be used as the gain control code of the FPGA 246 upon the transmission operation in the GMSK modulation mode as they are. That is, the calibration in case where the transmission is made in the GMSK modulation mode of FIG. 6 can be omitted.

In the embodiment, the difference X between the design value and the measured value calculated from the gain control codes "FPGAG_V1" and "FPGAG_V2" obtained by the calibration for the EDGE modulation mode is added to the default value "IPGAG" of the IPGA 248 on the forward path and its added result is used as the gain setting code "IPGAG" for the IPGA 248. In contrast, in the embodiment, the gain control code "FPGAG_V2" obtained by the calibration for the EDGE modulation mode is used as the gain control code of the FPGA 246 in the GMSK modulation mode. The reason thereof is that in the GMSK modulation mode the IPGA 248 on the forward path is set to the off state even upon transmission and the switch SW2 is connected to the DC voltage VDC similarly to the case where the calibration is made, so that the variable gain amplifier 242a (242b) is supplied with the fixed voltage VLDO through the amplifier 249 to be operated with the gain fixed, while the FPGA 246 on the feedback path is set to the operation state since the phase control loop is required to be operated even in the GMSK modulation mode.

Figure 7:
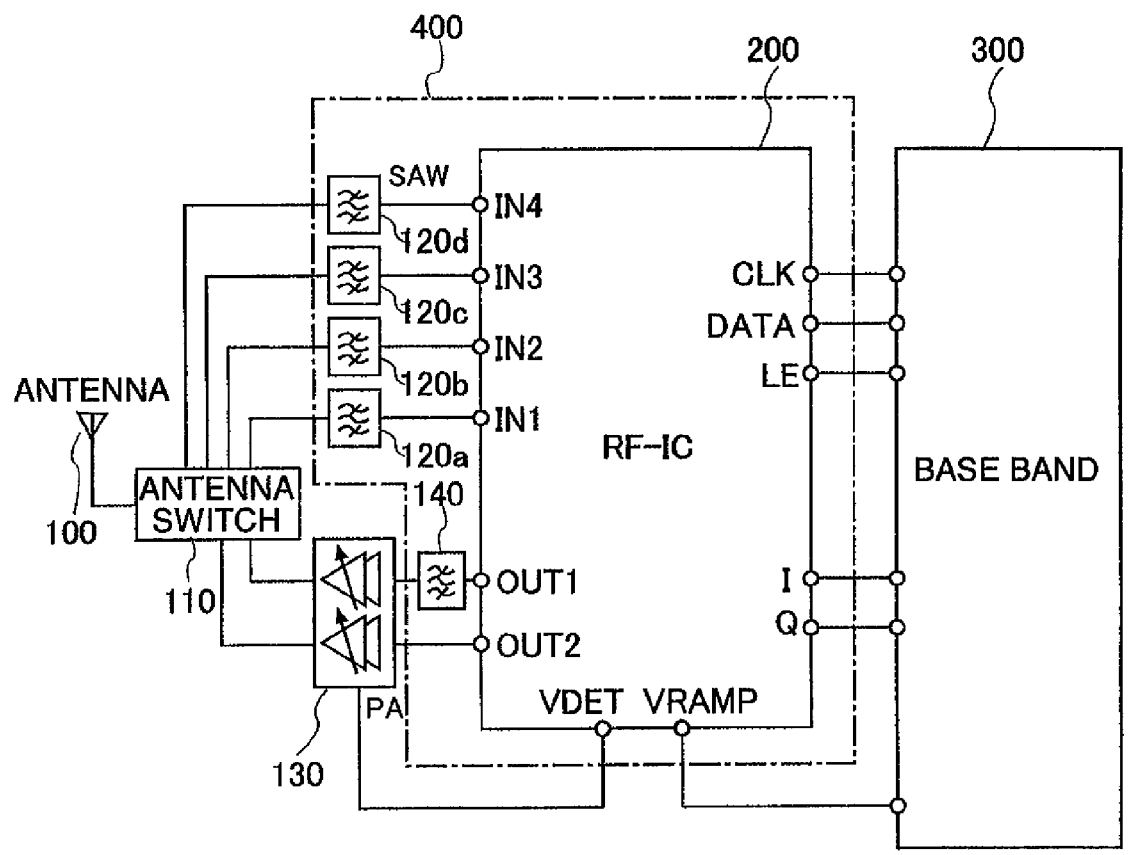
FIG. 7 is a block diagram illustrating a configuration example of a wireless communication system using the high-frequency integrated circuit of the embodiment.

FIG. 7 is a block diagram illustrating an example of a wireless communication system using the high-frequency IC of the embodiment.

As shown in FIG. 7, the wireless communication system includes a transmitting/receiving antenna 100 of radio signals, a switch 110 which changes over the antenna to make transmission and reception, high-frequency filters 120a to 120d constituted by SAW filters which remove unnecessary waves from a received signal, a high-frequency power amplifier circuit (power module) 130 which amplifies a transmission signal, the high-frequency IC 200 of the embodiment which demodulates a received signal and modulates a transmission signal, and a baseband circuit 300 which makes baseband processing such as conversion of audio signal and data signal to be transmitted into I signal of in-phase component to reference wave and Q signal of orthogonal component and conversion of received and modulated I and Q signals into audio signal and data signal and transmits a signal for controlling the high-frequency IC 200.

The high-frequency filters includes a filter 120a for passing through a received signal in the frequency band of PCS 1900, a filter 120b for passing though a received signal in the frequency band of DCS 1800, and filters 120c and 120d for passing through a received signal in the frequency band of GSM system. Further, although not limited, an SAW filter 140 is connected between a terminal of the high-frequency IC 200 from which a transmission signal of GSM system is outputted and the power module 130. The high-frequency IC 200 and the baseband circuit 300 are formed on separate semiconductor chips as semiconductor integrated circuits.

The high-frequency IC 200 and the filters 120a to 120d and 140 are mounted on an insulating substrate such as a ceramic substrate to be formed into a module 400. In the specification, a plurality of semiconductor chips and discrete components are mounted on an insulating substrate such as a ceramic substrate or a package having the surface and the inside in which printed wiring is formed and are connected by the printed wiring or bonding wire to fulfill a predetermined role to thereby be formed to be treated as one electronic component, which is named a module.

The present invention made by the inventor has been described concretely on the basis of the embodiment, although it is needless to say that the present invention is not limited to the embodiment and various variations may be made thereto without departing from the spirit and scope of the invention. For example, in the embodiment, the default values of the control codes designating the gains of the variable gain amplifiers FPGA and IPGA in the high-frequency IC 200 are stored in the non-volatile memory in the baseband circuit 300 and are supplied to the high-frequency IC from the baseband circuit upon turning on of the power supply to be stored in the register 252, although a non-volatile memory for storing the default values of the control codes designating the gains of the variable gain amplifiers FPGA and IPGA may be provided in the high-frequency IC.

Further, in the embodiment, the calibration of the amplitude control loop is executed only once upon turning on of the power supply, although the calibration may be executed at any time during the period that transmitting/receiving operation is not made, such as a waiting time.

In the foregoing description, the present invention is applied to a quadruple band system formed to be able to make communication for four bands in accordance with three communication systems of GSM 850 and 900, DSC 1800 and PCS 1900, although the present invention can be applied to a single band system which makes only communication in GSM system using modulation by GMSK modulation mode and 8-PSK modulation mode.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A communication device including a transmission oscillator for generating a transmission signal having a predetermined frequency, a first variable gain amplifier for amplifying a signal output by said transmission oscillator, a phase control loop having an amplitude detector and for controlling a phase of the transmission signal output by said transmission oscillator, and an amplitude control loop for controlling a gain of said first variable gain amplifier to control an amplitude of the transmission signal output by said first variable gain amplifier, said communication device executing calibration of said amplitude control loop, comprising:

a second variable gain amplifier disposed on a feedback path of said amplitude control loop which feeds back a signal related to an output level of the transmission signal to said amplitude detector; and a third variable gain amplifier disposed on a forward path extending from said amplitude detector to said first variable gain amplifier, wherein upon execution of said calibration, a gain of said second variable gain amplifier is varied in a state where a first value for setting a gain of said first variable gain amplifier is given to said first variable gain amplifier to thereby detect a gain of said second variable gain amplifier at the time when an output of said second variable gain amplifier is equal to a predetermined value, the gain of said second variable gain amplifier is varied in a state where a second value for setting the gain of said first variable gain amplifier is given to said first variable gain amplifier to thereby detect a gain of said second variable gain amplifier at the time when the output of said second variable gain amplifier is equal to a predetermined value and decide a gain of said third variable gain amplifier based on a difference between said detected two gains of said second variable gain amplifier.

2. A communication device according to claim 1, comprising:

an amplitude comparator which is disposed in said amplitude control loop is supplied with a reference signal and a feedback signal from said feedback path and compares said reference signal with said feedback signal and decides whether the output of said second variable gain amplifier is equal to the predetermined value or not based on an output of said amplitude comparator.

3. A communication device according to claim 1, wherein the gain of said second variable gain amplifier is held at the time when the output of said second variable gain amplifier is equal to the predetermined value, set as a gain upon transmission operation of said second variable gain amplifier, an output signal of said second variable gain amplifier is input to a phase comparator on said phase control loop and is set as a phase comparison signal of a carrier wave upon transmission operation that phase modulation is made with fixed amplitude.

4. A communication device according to claim 3, wherein the gain of said second variable gain amplifier is held at the time when the output of said second variable gain amplifier is equal to the predetermined value in the state where the second value for setting the gain of said first variable gain amplifier is given to said first variable gain amplifier upon execution of said calibration and said calibration upon transmission operation for phase modulation which is made with fixed amplitude is not executed.

5. A communication device according to claim 1, further comprising:

an amplifier disposed in a succeeding stage of said first variable gain amplifier and which has a gain controlled in accordance with an external signal indicating an output level and amplifies a transmission signal.

\* \* \* \* \*